United States Patent [19]
Palmour

[11] Patent Number: 5,506,421
[45] Date of Patent: Apr. 9, 1996

[54] POWER MOSFET IN SILICON CARBIDE

[75] Inventor: John W. Palmour, Cary, N.C.

[73] Assignee: Cree Research, Inc., Durham, N.C.

[21] Appl. No.: 980,753

[22] Filed: Nov. 24, 1992

[51] Int. Cl.$^6$ .............................................. H01L 31/0312
[52] U.S. Cl. ........................... 257/77; 257/330; 257/341; 257/339; 257/342; 257/496; 257/626
[58] Field of Search .......................... 257/77, 139, 339, 257/340, 341, 330, 495, 496, 500, 623, 626, 335, 337, 342

[56] References Cited

U.S. PATENT DOCUMENTS

| | | | |
|---|---|---|---|
| 3,844,029 | 10/1974 | Dibugnara | 257/750 |
| 4,219,835 | 8/1980 | Van Loon et al. | 257/330 |
| 4,608,584 | 8/1986 | Mihara | 257/336 |
| 4,642,666 | 2/1987 | Lidow et al. | 257/339 |
| 4,697,201 | 9/1987 | Mihara | 257/330 |
| 4,757,028 | 7/1988 | Konodoh et al. | 437/40 |
| 4,762,806 | 8/1988 | Suzuki et al. | 437/100 |
| 4,767,722 | 8/1988 | Blanchard | 257/341 |
| 4,860,084 | 8/1989 | Shibata | 257/288 |
| 4,865,685 | 9/1989 | Palmour . | |
| 4,908,682 | 3/1990 | Takahashi | 257/336 |
| 4,929,985 | 5/1990 | Takasaki | 257/51 |
| 4,931,408 | 6/1990 | Hshieh | 437/44 |
| 4,945,394 | 7/1990 | Palmour et al. | 257/77 |
| 4,947,218 | 8/1990 | Edmond et al. | 257/77 |
| 4,952,991 | 8/1990 | Kayama | 257/335 |
| 4,959,699 | 9/1990 | Lidow et al. | 257/328 |
| 4,965,647 | 10/1990 | Takahashi | 257/342 |
| 4,972,240 | 11/1990 | Murakami et al. | 257/335 |
| 4,974,059 | 11/1990 | Kinzer | 257/342 |
| 4,977,439 | 12/1990 | Esquivel et al. | 257/621 |
| 4,994,871 | 2/1991 | Chang et al. | 257/139 |
| 5,168,331 | 12/1992 | Yilmaz | 257/495 |
| 5,170,231 | 12/1992 | Fujii et al. | 257/77 |
| 5,225,032 | 7/1993 | Golecki | 156/612 |
| 5,233,215 | 8/1993 | Baliga | 257/490 |
| 5,313,092 | 5/1994 | Tsuruta et al. | 257/496 |

FOREIGN PATENT DOCUMENTS

| | | |
|---|---|---|
| 0159663A3 | 4/1985 | European Pat. Off. . |
| 4029368 | 1/1992 | Japan . |
| 4239778 | 8/1992 | Japan . |
| WO93/26047 | 12/1993 | WIPO . |

OTHER PUBLICATIONS

Sze, "Semiconductor Devices Physics and Technology", 1985, pp. 110–111.
Yoder et al., "Silicon Carbide Comes of Age," Naval Research Revies, 1989 pp. 26–33.
"High Temperature Operated Enhancement–Type β–SIC MOSFET" by Fuma et al., *Japanese Journal of Applied Physics*, vol. 27, No. 11, Nov. 1988, pp. L2143–L2145.
"Reactive Ion Etching of SiC Thin Films by Mixtures of Fluorinated Gases and Oxygen" by W. S. Pan, et al,. Journal of the Electrochemical Society, 137 (1990) Jan., No. 1, Manchester, NH, US.

(List continued on next page.)

*Primary Examiner*—Jerome Jackson
*Assistant Examiner*—John Guay
*Attorney, Agent, or Firm*—Bell, Seltzer, Park & Gibson

[57] ABSTRACT

The power metal oxide semiconductor field effect transistor (MOSFET) has a drain region, a channel region, and a source region formed of silicon carbide. The drain region has a substrate of silicon carbide of a first conductivity type and a drain-drift region of silicon carbide adjacent the substrate having the same conductivity type. The channel region is adjacent the drain-drift region and has the opposite conductivity type from the drain-drift region. The source region is adjacent the channel region and has the same conductivity type as the drain-drift region. The MOSFET also has a gate region having a gate electrode formed on a first portion of the source region, a first portion of the channel region, and a first portion of the drain region. A source electrode is formed on a second portion of the source region and a second portion of the channel region. Also, a drain electrode is formed on a second portion of the drain region.

19 Claims, 5 Drawing Sheets

OTHER PUBLICATIONS

IEEE Electron Device Letters, vol. 10, No. 10, pp. 520–522, entitled "Power Semiconductor Device Figure of Merit for High–Frequency Application," Dated Oct., 1989, Authored by B. Jayant Baliga.

IEEE Electron Device Letters, vol. 11, No. 11, pp. 455–457 entitled "Potential Impact of Emerging Semiconductor Technologies on Advanced Power Electronic Systems," Dated Nov., 1990, Authored by Krishna Shenai.

POWER MOSFET IN SILICON CARBIDE

RELATED APPLICATIONS

This invention is related to copending U.S. patent application Ser. No. 07/893,642 filed on Jun. 5, 1992.

1. Field of the Invention

This invention was made at least partially with government support under the National Aeronautical and Space Administration ("NASA"), Contract Number NAS-25956. The government may have certain rights in this invention. This invention relates to power metal oxide semiconductor field effect transistors ("MOSFETs"), and more particularly to a MOSFET formed in silicon carbide.

2. Background of the Invention

Power semiconductor devices, such as high-power bipolar junction transistors ("HPBT"), power metal oxide semiconductor field effect transistors ("MOSFET"), or gate turn-off thyristors ("GTO"), are semiconductor devices that are capable of controlling or passing large amounts of current and blocking high voltages. Power MOSFETS are generally known and one of the most critical parameters for a power MOSFET is the specific on-resistance (i.e., the resistance of the device in the linear region when the device is turned on). The specific on-resistance for a power MOSFET preferably should be as small as possible so as to maximize the source to drain current per unit area for a given source to drain voltage applied to the MOSFET. The lower the specific on-resistance, the lower the voltage drop is for a given current rating.

Conventional power MOSFETs are manufactured in silicon (Si). MOSFETs formed in Si, however, have certain performance limitations inherent in the Si material itself, such as the thickness of the drain-drift region. The largest contributory factor to specific on-resistance is the resistance of the drain-drift region of the MOSFET. The thickness and doping of the drain-drift region limit the on-resistance. As the rated voltage of a MOSFET is increased, typically the drain-drift region thickness is increased and the drain-drift region doping is decreased. Therefore, the resistance of the drain-drift region increases dramatically. Hence, the thickness of the drain-drift region should be minimized for any given rated voltage so as to minimize the specific on-resistance for the device.

These problems with on-resistance have been recognized and several MOSFET structures have been developed in an attempt to solve the on-resistance problems. Examples of such developments may be seen in U.S. Pat. No. 4,952,991 by Kayuma entitled "Vertical Field-Effect Transistor Having A High Breakdown Voltage And A Small On-Resistance"; U.S. Pat. No. 4,959,699 by Lidow, et al. entitled "High Power MOSFET With Low On-Resistance And High Breakdown Voltage"; U.S. Pat. No. 4,608,584 by Mihara entitled "Vertical Type MOS Transistor"; U.S. Pat. No. 4,931,408 by Hshich entitled "Method of Fabricating a Short-Channel Low Voltage DMOS Transistor"; U.S. Pat. No. 4,974,059 by Kinzer entitled "Semiconductor High-Power MOSFET Device"; U.S. Pat. No. 4,642,666 by Lidow et al. entitled "High Power MOSFET With Low On-Resistance And High Breakdown Voltage"; U.S. Pat. No. 4,965,647 by Takahashi entitled "Vertical MOS Field Effect Transistor Having A High Withstand Voltage And A High Switching Speed"; U.S. Pat. No. 4,860,084 by Shibata entitled "Semiconductor Device MOSFET With V-Shaped Drain Contact"; and U.S. Pat. No. 4,697,201 by Mihara entitled "Power MOSFET with Decreased Resistance In The Conducting State". These prior attempts to solve the problem included various structures of the Si semiconductor material to try to lower the on-resistance. These prior attempts, however, failed to adequately understand the inherent imitations in the Si semiconductor material itself.

Thus, there presently exists no power MOSFET having low on-resistance and a high temperature range for high voltages.

SUMMARY OF THE INVENTION

The present invention therefore provides a power MOSFET having a low on-resistance and a high temperature range for high voltages. By understanding and developing material processing techniques in silicon carbide, a power MOSFET formed in silicon carbide provides improvement in on-resistance and high temperature performance over conventional power MOSFETs formed in Si.

More particularly, the power metal oxide semiconductor field effect transistor (MOSFET) has a drain region, a channel region, and a source region formed of silicon carbide. The drain region has a substrate of silicon carbide of a first conductivity type and a drain-drift region of silicon carbide adjacent the substrate having the same conductivity type. The channel region is adjacent the drain-drift region and has the opposite conductivity type from the drain-drift region. The source region is adjacent the channel region and has the same conductivity type as the drain-drift region. The MOSFET also has a gate region having a gate electrode formed adjacent a first portion of the source region, a first portion of the channel region, and a first portion of the drain region. A source electrode is formed adjacent a second portion of the source region and a second portion of the channel region, A drain electrode is formed on a second portion of the drain region.

DESCRIPTION OF THE DRAWINGS

Some of the features and advantages of the present invention having been stated, others will become apparent as the description proceeds when taken in conjunction with the accompanying drawings, in which.

DETAILED DESCRIPTION

The present invention now will be described more fully hereinafter with reference to the accompanying drawings in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
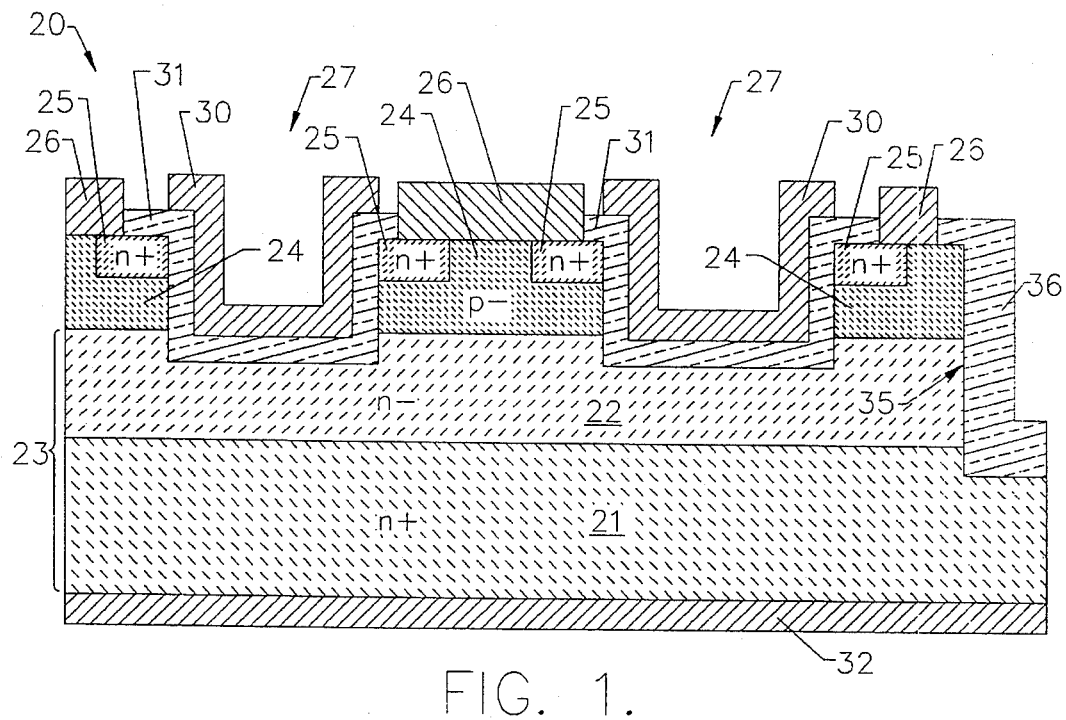
FIG. 1 a schematic partial cross-sectional view of a vertical MOSFET formed in silicon carbide having a U-shaped gate contact region according to the present invention.
Figure 2:
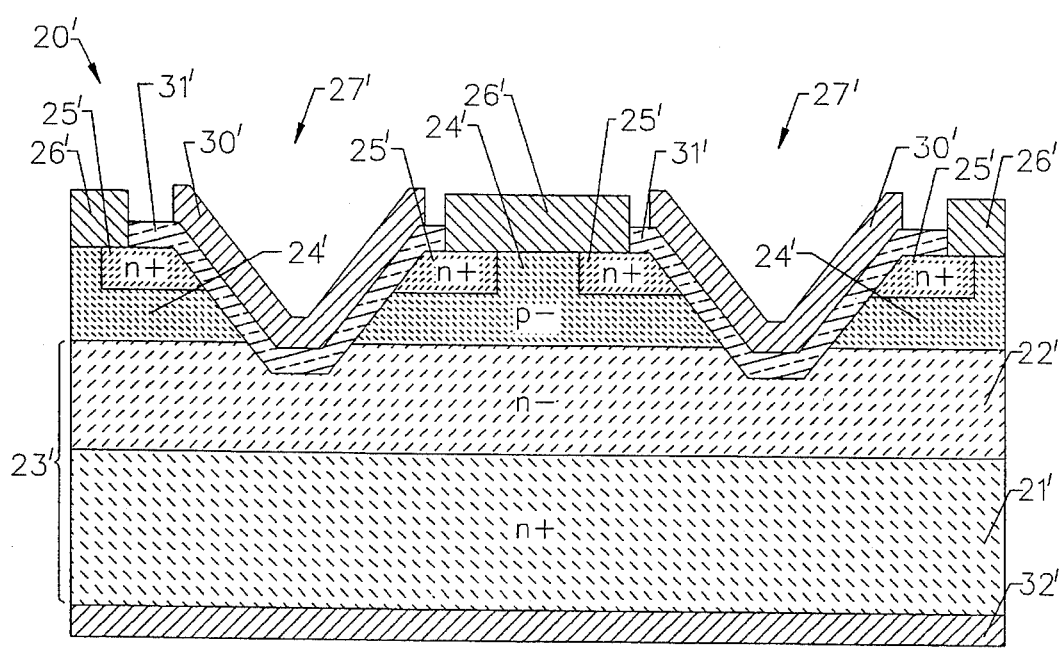
FIG. 2 is a schematic partial cross-sectional view of a vertical MOSFET having a v-shaped gate contact region ("VMOSFET") formed in silicon carbide according to another embodiment of the present invention.
Figure 3:
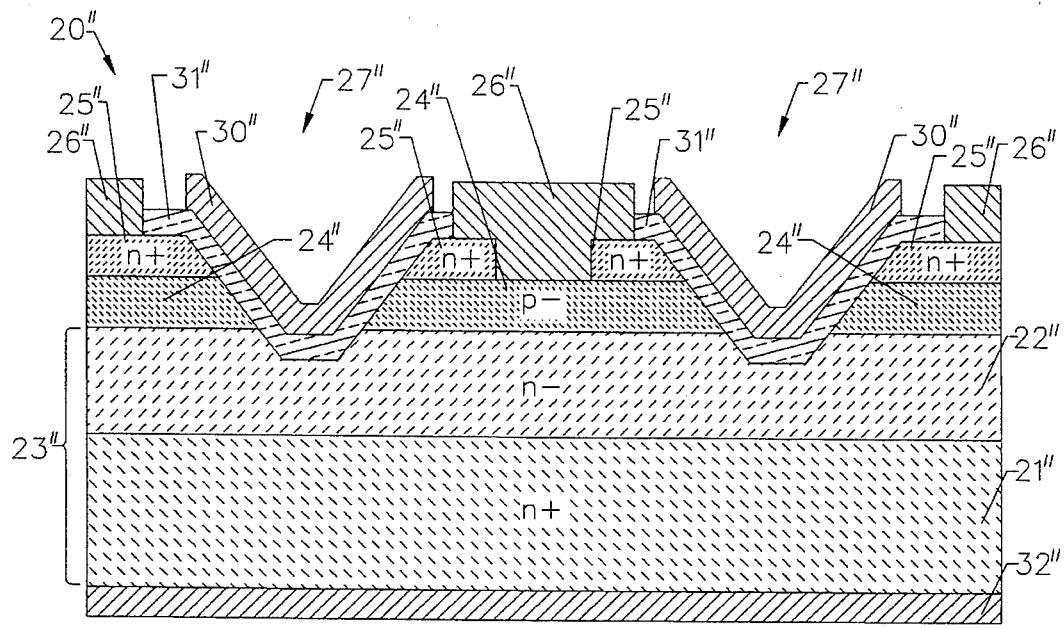
FIG. 3 is a schematic partial cross-sectional view of a VMOSFET formed in silicon carbide according to a further embodiment of the present invention.

Referring now to the drawings, the power MOSFET devices according to the present invention can be fabricated utilizing grounded structures as shown in FIGS. 1–3. FIG. 1 illustrates a schematic cross-sectional view of a power metal oxide semiconductor field effect transistor (MOSFET) formed in silicon carbide having a U-shaped gate contact region broadly designated at 27 according to the present invention. The MOSFET, broadly designated at 20, has a drain region 23 having a substrate 21 formed of silicon carbide (SIC) of a first conductivity type, which in the illustrated embodiment is shown as n+. The SiC as described herein typically has a 6H polytype, but as will be apparent to those skilled in the art the SiC may consist of 3C, 2H, 4H or 15R polytypes also. The drain region 23 also has a drain-drift region 22 of SiC having the same conductivity type shown, which in the illustrated embodiment is shown as n−. The n+ and n+ regions, as well as p+ and p−, are designated "+" and "−" for heavy and low doping levels respectfully of the same material. A channel region 24 is adjacent the drain-drift region 22 of the drain region 23 and has the opposite conductivity type shown as p−. A source region 2B having a source electrode shown as source contact 26 formed adjacent a portion thereof is adjacent the channel region 24 and has the same conductivity type as the drain-drift region 22, shown as n+. A gate region 27 has a gate electrode shown as gate contact 30 formed adjacent portions of the source region 25, the channel region 24, and the drain region 23. The gate region 27 is formed by trenching into these portions of the source 25, channel 24, and drain 23 regions as illustrated. A drain electrode shown as drain contact 32 is also formed adjacent a portion of the drain region 23.

Also, an insulating layer 31 is formed between the gate electrode 30 and the various portions of the source region 25, the channel region 24, and the drain region 23. The insulating layer 31 is typically an oxide layer such as silicon dioxide ($SiO_2$). Further, the MOSFET according to the invention has mesa edge terminations illustrated in FIG. 1 along one side thereof and designated at 35. The mesa edge termination also occurs, but is not shown, in the embodiments illustrated in FIGS. 2–4 and 7. The mesa edge termination is typically passivated with $SiO_2$, designated at 36, and may be thicker than other portions of the MOSFET.

Although both carbon-face (C-face) and silicon-face (Si-face) wafers may be fabricated, the C-face wafers are preferred and, hence, are described in detail below. The C-face is more optimal for this device since the oxide layer 31 grown on the top of the wafer, where the gate contact 30 overlaps the implanted source material and the bottom of the trench, is generally thicker than the oxide layer on the sidewalls because of anisotropic oxidation rates. This provides a thicker oxide where the dielectric failure is most likely, yet allows the oxide on the sidewall to remain relatively thin, which results in better transport properties.

The C-face substrates (n=1–4×10$^{18}$ per cubic centimeter (cm$^{-3}$) (1–4E18)) may have epitaxial structures grown in the following manner. The first epilayer grown (not illustrated in the drawings) is a 0.5 micrometers (μm) thick n+ layer on the substrate for the punch-through of the drain-drift region 22. The n− drain-drift region 22 is then grown with a doping density ranging from 5–7×10$^{15}$ cm$^{-3}$ (5–7E15) and a thickness of 4.3 μm. These conditions are designed to sustain a voltage (V) of about 50 V or more of drain bias before punch-through to the n+ layer 21. The channel layers 24 are grown with carrier concentrations ranging from 7–15×10$^{15}$ cm$^{-3}$ (7–15E15) and a thickness of 2.0 μm. After the n+ ion implant for the source region 25, the channel length should be about 1.5 μm, which should also be able to support 50 V without punch-through to the source region 25.

The device of FIG. 1 is fabricated as follows. First, the outer mesa pattern is reactive ion etched 0.5 μm into the SiC surface to act as an alignment mark for future levels. Polysilicon, 0.75 μm thick, is then deposited on the wafer, and patterned using reactive ion etching in dichlorodifluoromethane ($CCl_2F_2$). The remaining implant mask is patterned such that an entire wafer is implanted except an undersized pattern of the source contact 26. The mask is 2.5 μm undersized, meaning that the center 10 μm of the 15 μm wide source contact will be on non-implanted p-type material. The ion implantation of the source wells 25. is performed by triple implanting $N^+$ at 650 degrees Centigrade (° C.) under the following conditions, which results in a 2×10$^{20}$ cm$^{-3}$ (2E20) peak concentration:

E=40 keV, $\phi$=1.34×10$^{15}$ cm$^{-2}$
E=80 keV, $\phi$=2.18×10$^{15}$ cm$^{-2}$
E=150 keV, $\phi$=3.10×10$^{15}$ cm$^{-2}$ where E is the energy, keV is kilo-electron-volts, and $\phi$ is the dose in atoms/cm$^2$.

After implantation, the polysilicon is stripped and the wafers are annealed at 1500° C. in Argon (Ar) for 10 minutes. An Aluminum (Al) layer is then deposited and patterned to open windows for the reactive ion etching of the trenches. This pattern only opens the eight fingers that were 5 μm×250 μm long. The trenches are then etched through the n+ ion implanted material 25, the p-type channel layer 24, and into the n− drain region 23 in 100% of nitrogen trifluoride ($NF_3$) per 10% of nitrous oxide ($N_2O$); the depth of the etch is about 3.0 μm. The Al is then stripped and a fresh layer of Al is deposited and patterned once again in the pattern of the outer mesa termination 35. The material outside the mesa is etched about 7.2 μm deep, again using reactive ion etching ("RIE") with $NF_3$ penetrating all of the epilayers grown.

The wafers are then oxidized in wet oxygen ($O_2$) at 1100° C. for 30 minutes to form the gate oxide 31 and outer sidewall passivation layers 35. The oxide thickness on the top of the mesas is about 80 nanometers (nm) thick and, based on oxide breakdown calculations, the sidewall oxide thickness is about 40 nm thick. A 300 nm thick layer of a metal such as molybdenum (Mo) is then deposited on the wafers and is patterned to form the gate contact 30 by an appropriate technique, for example wet etching in a phosphoric/nitric/acetic acid mixture. The gate layer may also be formed of polysilicon. The 65 nm thick nickel (Ni) source contacts 26 are then deposited by first reactive ion etching the silicon dioxide (SiO$_2$) layer 31 in fluoroform (CHF$_3$) through windows in a photoresist and then depositing and lifting-off the Ni. The oxide is then etched off of the backside of the wafer and a 200 nm thick film of Ni is deposited on it for the drain contact 32.

The wafers are then annealed for two minutes in Ar per 4% of hydrogen (H$_2$) at 800° C. After annealing, oxidation resistant overlayers (not shown in the Figures) are then sputtered onto the wafers. The source 26 and gate contacts 30 are coated with Titanium (Ti)/Platinum (Pt)/Gold (Au) in an undersized pattern using the lift-off process. Likewise, the backs of the wafers are overcoated with Ti/Pt/Au.

Figure 4:
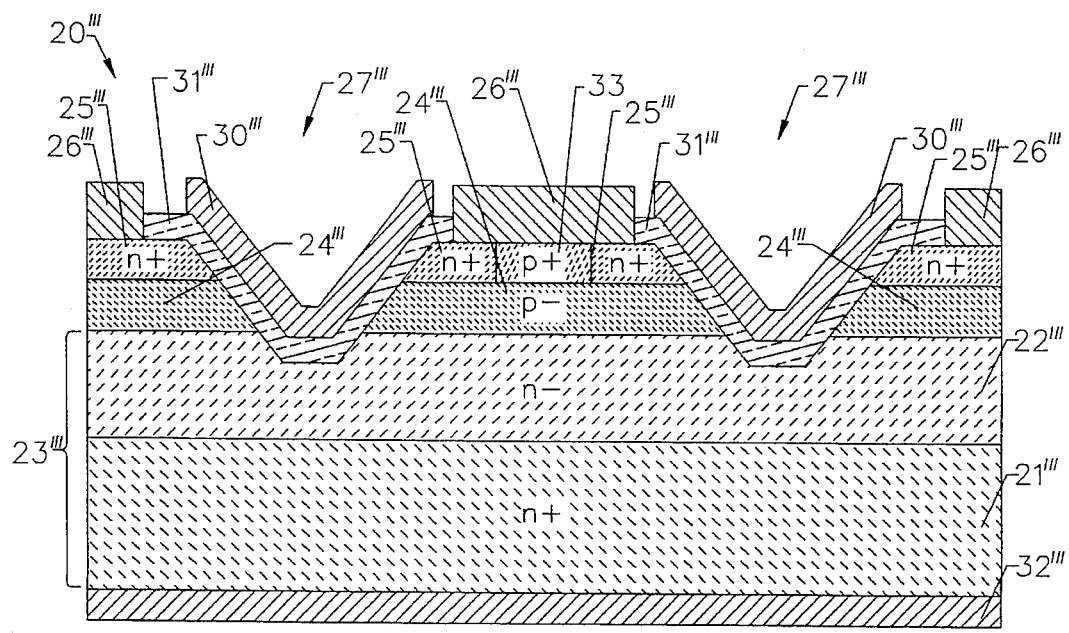
FIG. 4 is a schematic partial cross-sectional view of a VMOSFET formed in silicon carbide according to yet another embodiment of the present invention.

FIGS. 2–4 illustrate grounded vertical MOSFETS 20', 20'', 20''' having a v-shaped gate contact ("VMOSFET") according to three other embodiments of the invention. These embodiments have similar elements as shown in FIG. 1 and are designated prime ('), double prime (''), and triple prime (''') respectively. In the embodiment of FIG. 2, the n+ source region 25' is implanted in the p– channel region 24'. The source contact 26' is then formed on the n+ source 25' and p– channel 26' regions. In the embodiment of FIG. 3, the n+ source region 25'' is epitaxially grown on the p– channel region 24'' as illustrated. A portion of the n+ source region 25' is etched for contact with the p– channel region 24''. The source contact 26'' is then formed on the n+ source region 25'' and the p– channel region 24''. Also, in the embodiment of FIG. 4, the n+ source region 25''' is epitaxially grown on the p– channel region 24'''. A p+ region 33 is then implanted into the n+ source region 25''' for contact between the p– channel region 24''' and the source contact 26'41. It will also be apparent to those skilled in the art that the p+ implantated region 33 for contact between the p– channel region 24''' and the source contact 26''' may also be used in the embodiments illustrated in FIGS. 1–3. Ion implantation techniques may be used, and particularly the high temperature ion implantation techniques shown in U. S. Pat. No. 5,087,576 by Edmond et al. entitled "Implantation And Electrical Activation Of Dopants Into Monocrystalline Silicon Carbide" which is hereby incorporated by reference.

Figure 5:
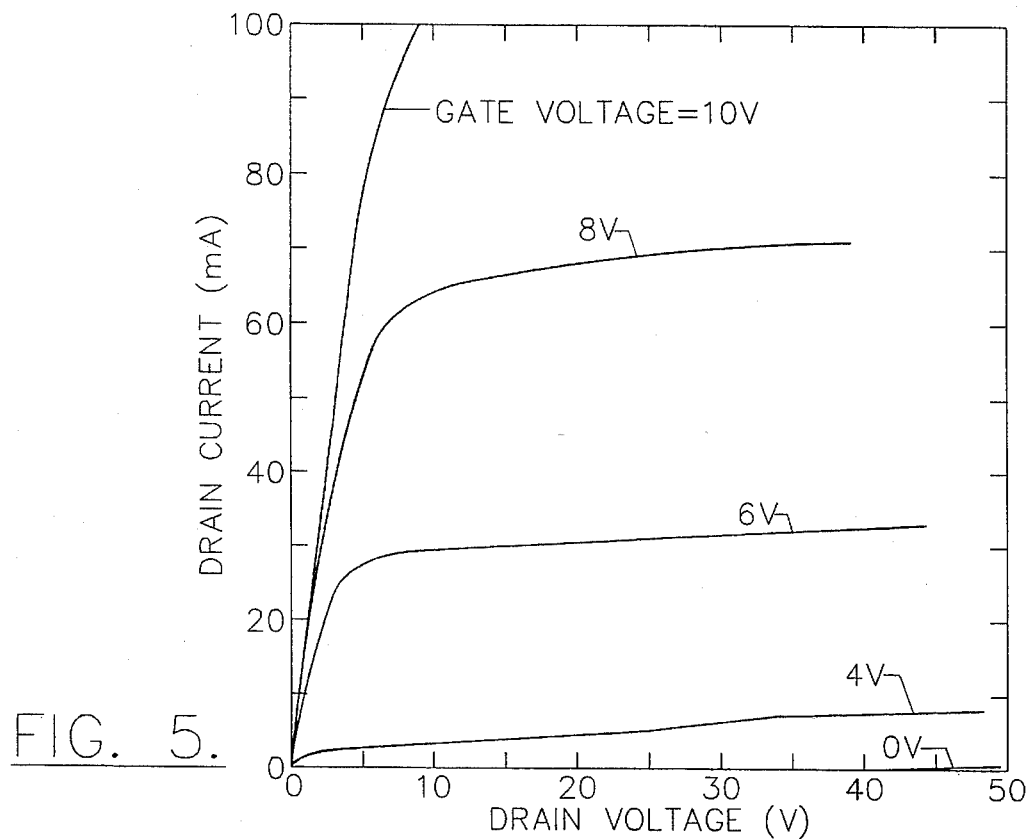
FIG. 5 is a plot of the drain current-voltage characteristics of a VMOSFET formed in silicon carbide having an active area of $6.7 \times 10^4$ cm$^2$ at a temperature of 300 K.
Figure 6:
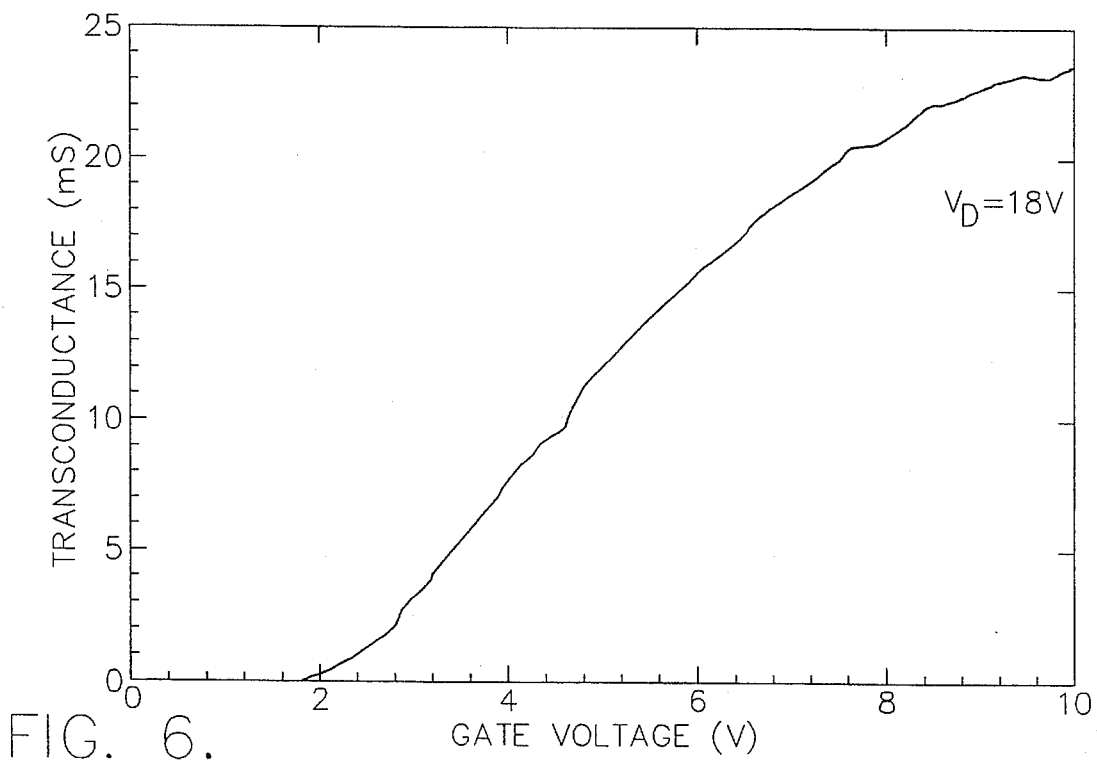
FIG. 6 is a plot of the transconductance gate voltage characteristics of a VMOSFET according to the present invention.

FIG. 5 shows the I–V curve of one of the lowest resistance devices. FIG. 5 is a plot of the drain current-voltage characteristics for the VMOSFET according to the present invention. FIG. 6 is a plot of the transconductance-gate voltage characteristics of the same VMOSFET. This particular wafer had a channel doping of p=9.5×10$^{15}$ cm$^{-3}$ (9.5E15). An on-current of 40 milliamperes (mA) was achieved with a 2.3 voltage (V) drop when the gate voltage (V$_G$) was only +10 V, resulting in an on-resistance of 57 ohms ($\Omega$) (since the active area for the device is 6.7×10$^{-4}$ square centimeters (cm$^2$), the drain-to-source resistance (R$_{DS(on)}$)=38 m$\Omega$-cm$^2$). The threshold voltage (V$_{th}$) of this device at room temperature ("RT") was 1.6 V and the maximum transconductance at drain voltage (V$_D$)=18 V and V$_G$=+10 V was 24 milliSiemens (mS) (6.0 mS/millimeter (mm)).

These devices were also characterized as a function of temperature. Another low doped power device had a RT V$_{th}$ of 3.2 V and transconductance of 5 mS/min. The R$_{DS(on)}$ of this device at V$_G$=+10 V was 49.6 m$\Omega$-cm$^2$. The V$_{th}$ dropped rapidly between RT and 150 degrees Centigrade (° C.) to 1.7 V and the R$_{DS(on)}$ decreased and then began to rise, with a value of 46.2 m$\Omega$-cm$^2$ at 150° C. The transconductance dropped to 3.5 ms/mm at this temperature. These devices operated well to 300° C. At this temperature, the voltage stabilized at about 1.6 V. The R$_{DS(on)}$ increased to 60 m$\Omega$-cm$^2$ and the transconductance decreased to 2.75 mS/mm. The device characteristics returned to their original characteristics after they were cooled down.

Accordingly, various oxidation techniques may also be used for these devices such as shown in copending U.S. patent Ser. No. 07/893,642 entitled "Method Of Obtaining High Quality Silicon Dioxide Passivation On Silicon Carbide And Resulting Passivated Structures" filed on Jun. 5, 1992 by the same inventor. This copending application is hereby incorporated herein by reference. These views illustrate V-shaped gate contacts for the MOSFET, but other various forms such as Double Diffused Metal Oxide Semiconductors (DDMOS) or planar MOSFETS may also be used. It has also been found that use of Al p-type oxidation causes low channel mobility in a thermally grown oxide because of high interface trap density at the SiO$_2$/SiC interface. Further, the doping levels for forming the illustrated embodiments may range from 2E$^{15}$ to 5E$^{18}$ atoms/cm$^3$.

Accordingly, vertical power MOSFETs were also fabricated with higher channel doping using the above referenced oxidation techniques as opposed to the low channel doping of the previous embodiments using conventional doping techniques. A thin layer of deposited polysilicon was used as the sacrificial layer prior to oxidation. In such use, polysilicon has several advantages over epitaxially grown undoped SiC. In addition to the more uniform coatings that are obtained, the resulting thermal oxides do not contain any of the various carbon oxide (CO$_x$) by-products of SiC oxidation. Also, the oxidation can be carried out at lower temperatures, but may also be for shorter times or both. Since Si oxidizes much faster than SiC, the polysilicon is consumed fairly rapidly, but the SiO$_2$ essentially stops when it reaches the SiC interface. Therefore, virtually no SiC is consumed, but the high quality of a thermal SiO$_2$/SiC interface will be obtained. While the presence of Al at this interface is still likely to cause interface states, the problem can be minimized as much as possible.

The wafers were grown on Si-face n+ wafers with a dopant density of 2.5–3×10$^{18}$ cm$^{-3}$ (2.5–3E18). The epitaxial structure of these wafers was similar to that previously described, except the drain region had a doping of n=1–2×10$^{16}$ cm$^{-3}$ (1–2E16) and the p-type channel doping ranged from 1–1.7×10$^{17}$ cm$^{-3}$ (1–1.7E17) and was 1.0 μm thick.

The device fabrication for these wafers was also similar to that described for the structures discussed earlier with low channel doping. The only differences were in the implant and oxidation conditions. The implants were made shallower since the oxide growth would not remove any material. The resulting gate length was about 0.5 μm. These conditions were:

E=25 keV, ϕ=9.02×10$^{14}$ cm$^{-2}$

E=40 keV, ϕ=1.34×10$^{15}$ cm$^{-2}$

E=80 keV, ϕ=2.17×10$^{15}$ cm$^{-2}$

E=150 keV, ϕ=3.11×10$^{15}$ cm$^{-2}$.

Also, the trenches were only etched to a depth of 1.3 μm because of the thinner p– layer. After the formation of the trenches and the mesas, the 40 nm thick sacrificial polysilicon layer was deposited, via low-pressure chemical vapor deposition ("LPCVD"). This layer was then oxidized at 1100° C. in wet O$_2$ for 9 minutes. The resulting oxide thickness was 78 nm thick. The rest of the device processing was identical to that described earlier.

The channel doping for one particular wafer was p=1.2×10$^{17}$ cm$^{-3}$ (1.2E17). An on-current of 22 mA was achieved at room temperature with a gate voltage of +16 V. The on-resistance at this gate voltage was 184 $\Omega$, giving an R$_{DS(on)}$=123 m$\Omega$-cm$^2$. The threshold voltage of this device at room temperature was 7.5 V and the maximum transconductance at V$_D$=20 V and V$_G$=+16 V was 6.8 mS (1.7 mS/mm). Although these numbers are not as good as those discussed earlier, it should be noted that the oxides are about twice as thick for these devices, which has a significant impact on decreasing the transconductance. The room temperature channel mobility estimated for this device was about 2.2 cm$^2$/V-seconds.

The low channel mobilities were found to arise with high levels of Al doping for the channel region due to the high interface trap density caused by the Al at the SiO$_2$/SiC interface. Although the inventors do not want to be bound by a particular theory, it appears that the use of boron (B) for doping of the channel region will reduce these low channel mobility problems. Hence, it will be apparent to those skilled in the art that B doping may be used herein where Al is described.

These devices were also characterized as a function of temperature. The decrease in threshold voltage for these devices was quite stable with increasing temperature. At 150° C., $V_{th}$ decreased to 6.7 V and the $R_{DS(on)}$ had slightly decreased to 117 mΩ-cm$^2$. The transconductance increased slightly to 1.8 mS/mm at this temperature. These devices also operated well to 300° C. At this temperature the $V_{th}$ had further decreased to about 6.3 V. The $R_{DS(on)}$ remained stable at 117 mΩ-cm$^2$ and the transconductance had increased to 2.0 mS/mm.

The $V_{th}$ is quite well behaved for both sets of devices, and are very close to the calculated values given the doping densities used. The average rate of decrease for the heavily doped device was about 4–5 millivolts (mV)/° C. which is about the same rate observed for Si MOSFETs. While $V_{th}$ for the low doped samples dropped rapidly from room temperature to 100° C., it then remained very stable with increasing temperature.

The transconductance for the high doped channel layers increased with temperature to about 200° C. This indicated that the devices were still dominated by the interface traps at RT and that they were being overcome at high temperature. The low doped samples showed very high RT transconductances that decreased with temperature. This is much closer to the ideal case, where the traps do not dominate the characteristics and transconductance drops with increasing temperature due to decreasing mobility.

Based on the best and most recent results obtained for the vertical MOSFETs with low channel doping ($R_{DS(on)}$=37.5 mΩ-cm$^2$), a 20 ampere (A) power MOSFET would have a die size of about 4 millimeters (mm)×4 mm for a 5 V drop. It is expected that better performance will occur so that a 1000 V power MOSFET with an $R_{DS(on)}$ of 0.9 mΩ-cm$^2$ may be provided.

Figure 7:
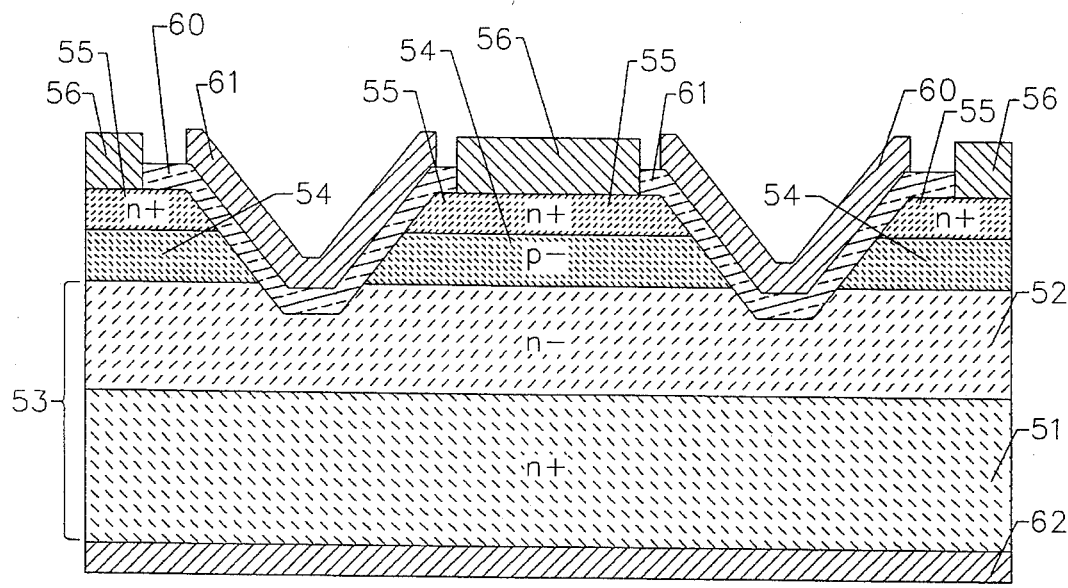
FIG. 7 is a schematic partial cross-sectional view of an ungrounded VMOSFET formed in silicon carbide according to yet another embodiment of the present invention.

FIG. 7 is an ungrounded VMOSFET according to yet another embodiment of the present invention. Although this is not the optimal structure, it allows all of the doping to be done via epitaxy and negates the need for ion implantation. The fabrication procedures are identical to those described earlier, except the ion implantation is eliminated. The oxides were conventionally grown from the SiC in wet O$_2$.

The first vertical devices fabricated with this structure did operate, but showed high gate leakage currents and the threshold voltages exceeded +10 V. Excessive leakage current was observed at drain biases higher than 25 V. The measured specific on-resistance of these devices at $V_G$=22 V was approximately 350 mΩ-cm$^2$. The high threshold voltage observed for these devices was due to the relatively high channel doping of p=1×10$^{17}$ cm$^{-3}$ (1E17). It was assumed that this heavy channel doping contributed to the low channel mobility by causing a high density of interface traps which, in turn, cause the low transconductance and high $R_{DS(on)}$, due to the degrading effects of Al in oxides as discussed earlier. The reason for doping the channel heavily was to allow short (submicron) gate lengths to be used with a 50–100 V bias, as is conventionally done for Si power MOSFETs. Based on the performance of these devices, the next set of wafers were grown with thicker (1.4 μm), lower doped channel regions with p=1–2×10$^{16}$ cm$^{-3}$ (1–2E16). The drain regions were doped at approximately n=3–8×10$^{15}$ cm$^{-3}$ (3–8E15) and were 5 μm thick. These thicknesses allowed 50 V operation before the depletion region punched through the drain to the n+ substrate.

These devices had much better characteristics than the heavily doped devices, but it was found that the lack of grounding on the channel layer influenced the I–V characteristics dramatically. The I–V curves showed very little current saturation until a drain voltage of about 60 V was reached. Very high resistance (13,000–15,000 Ω) was observed in the linear region of the curves. These characteristics improved dramatically when the devices were illuminated with a tungsten lamp. The linear region had a much lower resistance of 1150 Ω and the curves reach a saturation condition at less than $V_D$=10 V, although the saturation was rather sloped (output resistance=15,000 Ω). It is suspected that the illumination creates some electron-hole pairs at the p-n junctions that allow some bleeding off of the channel charge, causing a grounding effect. Likewise, the higher drain voltages cause more junction leakage, which also effectively grounds the channel layer. Although these RT characteristics are generally undesirable, these devices are expected to operate well at higher temperatures because the higher junction leakage currents allow grounding of the channel layer.

Figure 8:
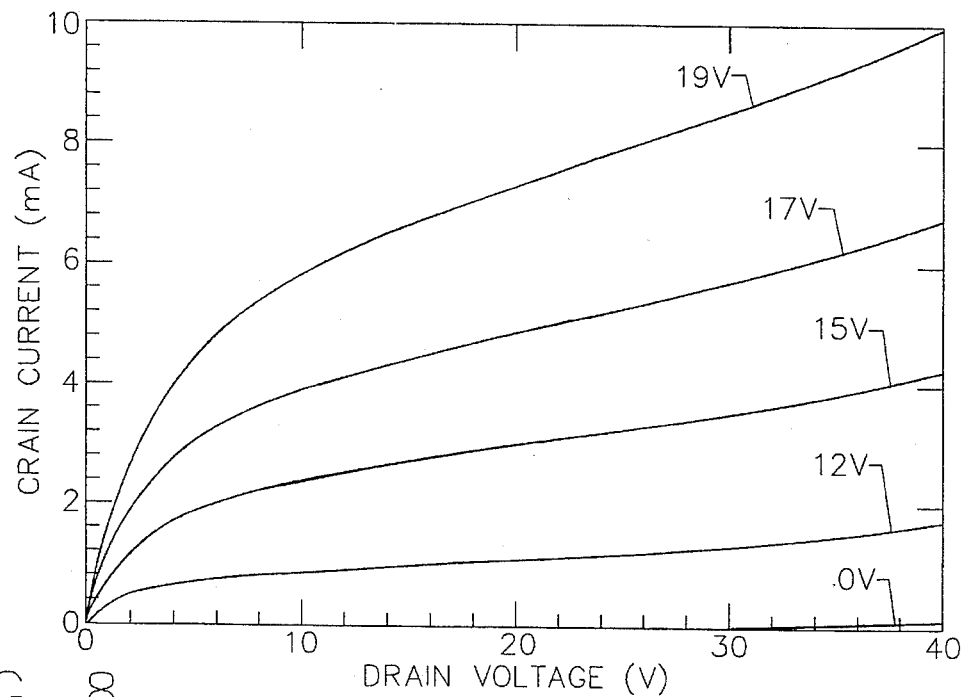
FIG. 8 is a plot of the drain current-voltage characteristics of an ungrounded VMOSFET according to the embodiment of FIG. 7.

FIG. 8 shows a typical set of I–V curves obtained for one of these ungrounded devices under illumination. FIG. 8 is a plot of the current-voltage characteristics for an ungrounded VMOSFET having a gate length of 1.4 μm and a gate periphery of 4 mm according to another embodiment of the present invention. This device had a channel doping of about p=1.3×10$^{16}$ cm$^{-3}$ (1.3E16). The threshold voltage was $V_{th}$= +5.5 V and the maximum transconductance was 1.57 mS (about 0.39 mS/mm). The resistance in the linear region was about 635 Ω, which corresponds to an $R_{DS(on)}$ of about 430 mΩ-cm$^2$ at $V_G$=19 V.

Figure 9:
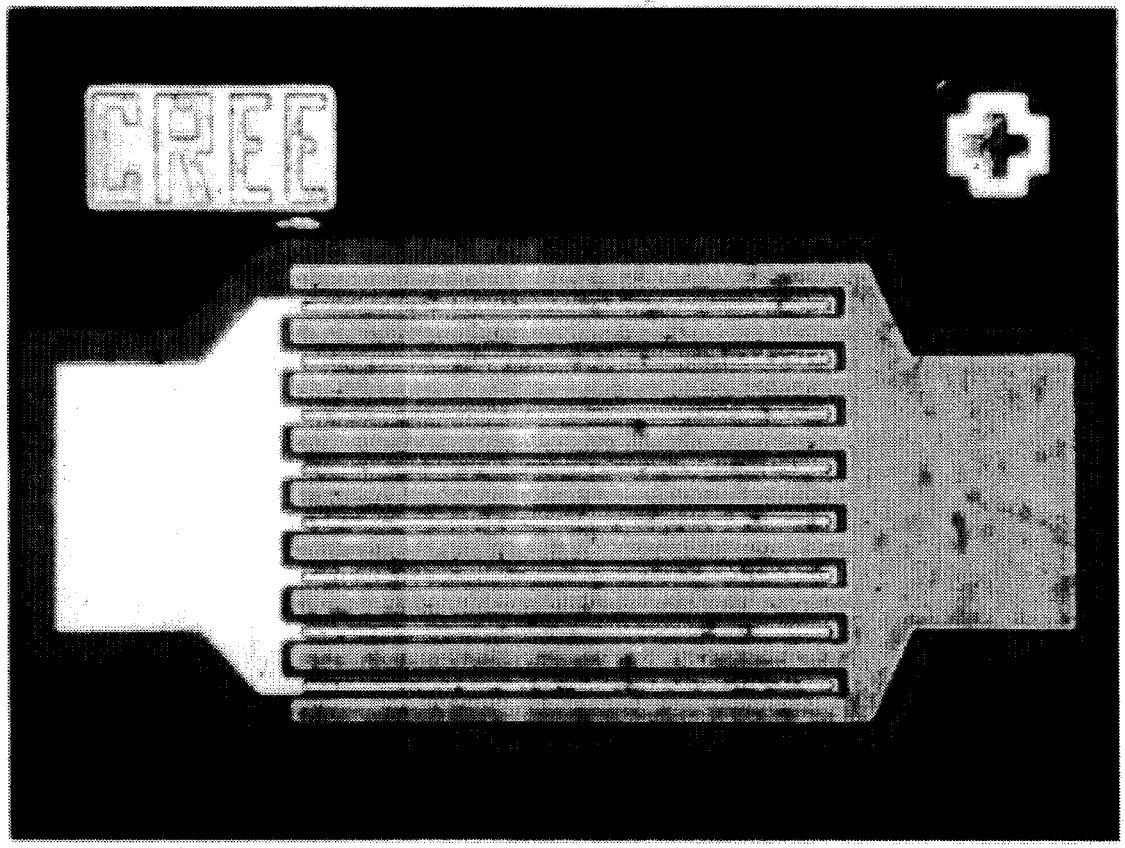
FIG. 9 is a photographic view of the mask used to form the MOSFET according to the present invention.

FIG. 9 is a photographic view of the interdigitated mask design used to form a MOSFET according to the present invention. The mask design for these small area devices has the multiple fingered trench design discussed earlier. The left contact pad with eight fingers is the gate contact. There is a 5 μm×250 μm wide trench etched in each finger, with the 10 μm wide gate contact overlapping it. Surrounding the gate fingers are nine source contact fingers that come from the contact pad on the right. The large outline surrounding these fingers is where the mesa edge termination is etched through the epilayers down to the substrate. This mesa edge termination confines the depletion region in the drain-drift layer and its area is 1.03×10$^{-3}$ cm$^{-2}$. The active area of the device, however, where the source and gate fingers are located, is 6.7×10$^{-4}$ cm$^{-2}$. Although the mask was used for the UMOS devices, the other VMOS cross-sectional designs, such as shown in FIGS. 2–4 and 7, may also use an interdigitated mask for forming the MOSFET. Further, it will be apparent to those skilled in the art that other various structures, such as square or hexagonal cells, may also be used for forming various MOSFET structures according to the present invention.

In the drawings and specification, there has been disclosed a typical preferred embodiment of the invention and, That which is claimed is:

1. A vertical power metal oxide semiconductor field effect translator (MOSFET) having a low on-resistance and a high temperature range, comprising:

a C-face substrate of silicon carbide having a first conductivity type;

a first layer of silicon carbide positioned to overlie said C-face substrate and having said first conductivity type for forming a drain-drift region;

a second layer of silicon carbide positioned to overlie said first layer and having a second conductivity type, said second layer forming a channel region;

a third layer of silicon carbide positioned to overlie said second layer and having said first conductivity type, said third layer forming a source region;

a trench formed in portions of said source and drain-draft regions and in portions of said channel region;

an insulating layer positioned to overlie said trench;

a gate electrode positioned to overlie said insulating layer;

a source electrode positioned to overlie at least a portion of said source region; and a drain electrode positioned to overlie at least a portion of said drain region, and wherein for a predetermined voltage being applied to said drain electrode, said drain-drift region has a thickness less than and a doping level higher than a comparable silicon MOSFET having a similar breakdown voltage for providing a low on-resistance and thereby obtain the predetermined voltage.

2. A MOSFET according to claim 1, wherein said source and drain electrodes comprise nickel.

3. A MOSFET according to claim 1, wherein said gate includes a gate contact formed of metal.

4. A vertical power MOSFET according to claim 1, further comprising a mesa edge termination of said source, said channel, and said drain-drift regions.

5. A vertical power MOSFET according to claim 1, wherein at least one of said regions of silicon carbide has a polytype selected from the group consisting of 3C, 2H, 4H, 6H, and 15R.

6. A vertical power MOSFET according to claim 1, wherein said first conductivity type comprises n-type silicon carbide and said second conductivity type comprises p-type silicon carbide.

7. A vertical power MOSFET according to claim 1, wherein said first conductivity type comprises p-type silicon carbide and said second conductivity type comprises n-type silicon carbide.

8. A vertical power MOSFET according to claim 1, wherein said channel region is doped with aluminum.

9. A vertical power MOSFET according to claim 1, wherein said channel region is doped with boron.

10. A vertical power MOSFET according to claim 1, wherein said channel region has a doping range from 2E15 to 5E18 atoms/cm$^3$.

11. A vertical power metal oxide semiconductor field effect transistor (MOSFET) having a low on-resistance and a high temperature range, comprising:

a drain region formed of silicon carbide, said drain region having a C-face substrate of silicon carbide of a first conductivity type and a drain-drift region of silicon carbide positioned to overlie said C-face substrate having said first conductivity type;

a channel region positioned to overlie said drain-drift region formed of silicon carbide and having a second conductivity type;

a source region positioned to overlie said channel region and having said first conductivity type;

a source electrode positioned to overlie at least a first portion of said source region;

a drain electrode positioned to overlie at least a first portion of said drain region;

a trench formed in second portions of said source and drain regions and in portions of said channel region; and a gate electrode positioned to overlie said trench and adjacent said second portions of said source and drain regions and in said portions of said channel region, and wherein for a predetermined voltage being applied to said drain electrode, said drain-drift region has a thickness less than a doping level higher than a comparable silicon MOSFET having a similar breakdown voltage for providing a low on-resistance and thereby obtain the predetermined voltage.

12. A vertical power MOSFET according to claim 11, further comprising a mesa edge termination of said source, said channel, and said drain-drift regions.

13. A vertical power MOSFET according to claim 11, wherein said first conductivity type comprises n-type silicon carbide and said second conductivity type comprises p-type silicon carbide.

14. A vertical power MOSFET according to claim 11, wherein said first conductivity type comprises p-type silicon carbide and said second conductivity type comprises n-type silicon carbide.

15. A vertical power MOSFET according to claim 11, wherein said channel region is doped with aluminum.

16. A vertical power MOSFET according to claim 11, wherein said channel region is doped with boron.

17. A vertical power MOSFET according to claim 11, wherein said channel region has a doping range from 2E15 to 5E18 atoms/cm$^3$.

18. A vertical power MOSFET according to claim 11, wherein said trench has a substantially U-shape.

19. A vertical power MOSFET according to claim 11, wherein said trench has a substantially V-shape.

* * * * *